United States Patent
Despont et al.

(10) Patent No.: US 11,822,289 B2
(45) Date of Patent: Nov. 21, 2023

(54) METHOD FOR MANUFACTURING A SPIRAL SPRING

(71) Applicant: CSEM CENTRE SUISSE D'ELECTRONIQUE ET DE MICROTECHNIQUE SA—RECHERCHE ET Developpement, Neuchâtel (CH)

(72) Inventors: Michel Despont, Cheseaux-Noréa (CH); Frédéric Kohler, Avry-sur-Matran (CH); Olivier Hunziker, Vevey (CH); Jean-Luc Bucaille, Présilly (FR)

(73) Assignee: CSEM CENTRE SUISSE D'ELECTRONIQUE ET DE MICROTECHNIQUE SA—RECHERCHE ET DEVELOPPEMENT, Neuchâtel (CH)

( * ) Notice: Subject to any disclaimer, the term of this patent is extended or adjusted under 35 U.S.C. 154(b) by 762 days.

(21) Appl. No.: 16/970,835

(22) PCT Filed: Feb. 21, 2019

(86) PCT No.: PCT/IB2019/051410
§ 371 (c)(1),
(2) Date: Aug. 18, 2020

(87) PCT Pub. No.: WO2019/166922
PCT Pub. Date: Sep. 6, 2019

(65) Prior Publication Data
US 2020/0379408 A1 Dec. 3, 2020

(30) Foreign Application Priority Data
Mar. 1, 2018 (EP) .................................... 18159345

(51) Int. Cl.
*G04B 17/06* (2006.01)
*C30B 29/06* (2006.01)
(Continued)

(52) U.S. Cl.
CPC ............ *G04B 17/066* (2013.01); *C30B 29/06* (2013.01); *C30B 33/12* (2013.01); *G03F 7/20* (2013.01); *G04D 3/0041* (2013.01)

(58) Field of Classification Search
CPC ....... G04B 17/066; C30B 29/06; C30B 33/12; G03F 7/20; G04D 3/0041; B29L 2031/774; B29L 2031/00; B29L 2031/7742
See application file for complete search history.

(56) References Cited

U.S. PATENT DOCUMENTS 8,294,337 B2  10/2012  Kawai et al.
8,296,953 B2  10/2012  Buhler et al.
(Continued)

FOREIGN PATENT DOCUMENTS

CH    711828 A2    5/2017
CN  101361027 A    2/2009
(Continued)

OTHER PUBLICATIONS

Taiwanese Search Report for TW Application No. 108105285 dated Feb. 15, 2022, 3 pages.
(Continued)

*Primary Examiner* — Lawrence Averick
(74) *Attorney, Agent, or Firm* — NIXON & VANDERHYE

(57) ABSTRACT

Disclosed is a method including: a) obtaining a substrate extending in a predetermined plane with a first layer parallel to the plane; b) forming a through-hole in the first layer; c) depositing a second layer on the first, the second layer filling (Continued)

the a through-hole to form a bridge of material; d) etching a hairspring in an etching layer made up of the second layer or the substrate, the one of the second layer and the substrate in which the a hairspring is not etched constituting a support, the bridge of material connecting the hairspring to the support perpendicular to the predetermined plane; e) removing the first layer, the hairspring remaining attached to the support by the bridge of material; f) subjecting the hairspring to a thermal treatment; and g) detaching the hairspring from the support.

20 Claims, 2 Drawing Sheets

(51) Int. Cl.
  *G04D 3/00* (2006.01)
  *C30B 33/12* (2006.01)
  *G03F 7/20* (2006.01)

(56) References Cited

U.S. PATENT DOCUMENTS

| | | | | |
|---|---|---|---|---|
| 8,333,501 | B2 * | 12/2012 | Levingston | G04B 17/066 368/177 |
| 10,018,965 | B2 | 7/2018 | Christan et al. | |
| 10,539,926 | B2 * | 1/2020 | Bossart | G04B 17/063 |
| 11,042,124 | B2 * | 6/2021 | Ikeda | G04B 17/066 |
| 11,429,065 | B2 * | 8/2022 | Bossart | G04B 15/14 |
| 2005/0019974 | A1 | 1/2005 | Lutz et al. | |
| 2009/0116343 | A1 * | 5/2009 | Levingston | F16F 1/10 368/140 |
| 2017/0108831 | A1 * | 4/2017 | Bossart | G04B 17/063 |
| 2017/0285573 | A1 * | 10/2017 | Manousos | G04B 19/12 |
| 2017/0371300 | A1 * | 12/2017 | Ikeda | C25D 13/12 |
| 2018/0142749 | A1 * | 5/2018 | Maennicke | F16F 1/10 |
| 2019/0171164 | A1 * | 6/2019 | Bossart | G04B 19/042 |

FOREIGN PATENT DOCUMENTS

| | | |
|---|---|---|
| CN | 101550978 A | 9/2012 |
| EP | 0 732 635 | 9/1996 |
| EP | 1 422 436 | 5/2004 |
| EP | 1 791 039 A1 | 5/2007 |
| EP | 2 104 007 | 9/2009 |
| EP | 3 181 938 | 6/2017 |
| EP | 3 181 939 | 6/2017 |
| JP | 2006-528560 A | 12/2006 |
| JP | 2017-090267 A | 5/2017 |
| TW | 201001103 A | 1/2010 |
| TW | 201109545 A | 3/2011 |
| TW | 201732466 A | 9/2017 |
| WO | 2017/006228 A1 | 1/2017 |

OTHER PUBLICATIONS

International Search Report for PCT/IB2019/051410 dated May 23, 2019, 5 pages.

Written Opinion of the ISA for PCT/IB2019/051410 dated May 23, 2019, 5 pages.

* cited by examiner

METHOD FOR MANUFACTURING A SPIRAL SPRING

CROSS-REFERENCE TO RELATED APPLICATIONS

This application is the U.S. national phase of International Application No. PCT/IB2019/051410 filed Feb. 21, 2019 which designated the U.S. and claims priority to European Application No. 18159345.0 filed Mar. 1, 2018, the entire contents of each of which are hereby incorporated by reference.

BACKGROUND OF THE INVENTION

Field of the Invention

The present invention relates to a method for manufacturing a spiral spring, i.e. a spring comprising an elastic blade shaped as a spiral. In a typical application, the spiral spring is intended to equip a balance to form therewith the resonator of a timepiece movement. Such a timepiece spiral spring is generally fixed by its inner end, via a collet, to a balance shaft and by its outer end, via a stud or other fixing member, to a bridge of the movement called "balance cock".

Description of the Related Art

Patent application EP 3181938 of the present applicant describes a method for manufacturing a spiral spring of a predetermined stiffness according to which a) a spiral spring is formed with dimensions greater than the dimensions necessary to obtain the spiral spring of a predetermined stiffness, b) the stiffness of the spiral spring thus formed is determined, c) the thickness of material to be removed to obtain the spiral spring of a predetermined stiffness is calculated and d) the calculated thickness of material is removed from the spiral spring formed during step a). Such a method enables to increase the dimensional accuracy and to decrease the manufacturing dispersions between spiral springs formed from a single wafer or from different wafers. The dimensional quality can still be improved by repeating steps b), c) and d). Step a) is performed, for example, by etching a silicon wafer. Step d) can then consist in oxidizing the silicon spiral spring, for example by thermal oxidation, in order to transform the thickness of material to be removed into silicon oxide, and then in removing the silicon oxide. After step d), an operation called "thermal compensation" can be performed to make the stiffness of the spiral spring, more precisely the frequency of the resonator of which the spiral spring is intended to form part, insensitive to thermal variations. In the case of a silicon spiral spring, the latter can be coated with a silicon oxide layer, for example by thermal oxidation, according to the teaching of patent EP 1422436. This silicon oxide layer also serves to increase the mechanical strength of the silicon spiral spring.

Another patent application from the applicant, EP 3181939, describes a method for manufacturing a spiral spring of a predetermined stiffness according to which a) a spiral spring is formed with dimensions lower than the dimensions necessary to obtain the spiral spring of a predetermined stiffness, b) the stiffness of the spiral spring thus formed is determined, c) the thickness of material that misses to obtain the spiral spring of a predetermined stiffness is calculated and d) the spiral spring formed during step a) is modified to compensate for the missing thickness of material, where steps b), c) and d) can be repeated. This method also enables to increase the dimensional accuracy and to decrease the manufacturing dispersions between spiral springs formed from a single wafer or from different wafers. Step a) is performed, for example, by etching a silicon wafer. After step d), a thermal compensation operation can be performed to make the stiffness of the spiral spring, more precisely the frequency of the resonator of which the spiral spring is intended to form part, insensitive to thermal variations. In the case of a silicon spiral spring, the latter can thus be coated with a silicon oxide layer according to the teaching of patent EP 1422436. This silicon oxide layer also serves to increase the mechanical strength of the silicon spiral spring.

According to a typical embodiment of the above methods, several spiral springs are simultaneously formed in a single silicon wafer in step a). These spiral springs remain attached to the wafer by bridges of material during steps b), c) and d) as well as during the thermal compensation operation, and then are detached from the wafer. These bridges of material radially link the outer turn of the spiral springs to the wafer, as illustrated in FIG. 7 of patent application EP 3181938 and in FIG. 6 of patent application EP 3181939. The other turns and the collet of the spiral springs cannot be attached to the wafer.

It is easily understood that this manner of attaching the spiral springs to the wafer does not enable the spiral springs to be kept without deformation as they are being manufactured, in particular as they are being subjected to the thermal oxidation operations in the case of a silicon spiral spring. When the wafer is in a horizontal position, the spiral springs do not remain planar but take the shape of a basin. In a vertical position, the relative position of the turns is modified, with certain turns moving closer to each other on one side and moving away from each other on the other side. At room temperature these deformations have no consequences because they remain elastic. On the other hand, during thermal treatments in which the spiral springs are placed in a furnace the temperatures of which may be greater than 1000° C., these deformations become permanent and are even intensified by the decrease of the stiffness of silicon. The resulting spiral springs may thus have between their inner end and their outer end a height difference greater than the height of each turn. This increases the size of the spiral springs which, once mounted in movements, may contact other components during normal functioning or during impacts, which may cause damages. These permanent deformations of the spiral springs may also cause the turns to touch each other during normal functioning of the movement or during impacts and to stick to each other, or to stick to parts of the movement like the balance cock. Access to other components of the movement, such as the index assembly for setting the rate, may be prevented. Moreover, these permanent deformations may affect isochronism.

The extent of these permanent deformations varies according to the weight and the stiffness of the turns, the time spent in the furnace and the furnace temperature. It can be reduced by changing either one of these last two parameters but to the detriment of productivity.

There is also known from patent EP 0732635 of the applicant a method for manufacturing a micromechanical piece according to which cavities are dug in a substrate while portions are left which will then form bridges of material, a crystalline material plate is welded on the substrate and then the micromechanical piece is etched in the crystalline material plate, this piece as well as other pieces of a same batch being held on the substrate by the bridges of material. This method is continued by one or more further treatments performed on the pieces and ends by the rupture of the bridges of material to detach the pieces from the substrate. With such a method, the thermal exchanges between the crystalline material plate and the substrate during etching are insufficient to guarantee good etching homogeneity. Moreover, a welding operation is necessary.

SUMMARY OF THE INVENTION

The present invention aims at remedying the aforementioned drawbacks, or at least at attenuating them, and proposes to this end a method according to claim 1, particular embodiments being defined in the dependent claims.

BRIEF DESCRIPTION OF THE DRAWINGS

Other features and advantages of the present invention will become apparent upon reading the following detailed description made with reference to the enclosed drawings in which.

DESCRIPTION OF THE PREFERRED EMBODIMENTS

Figure 1:
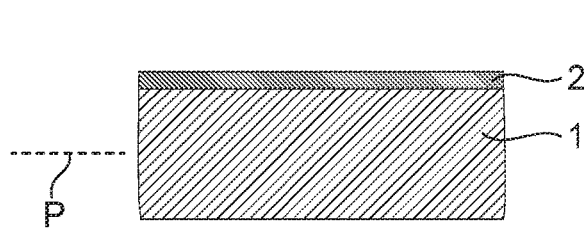
FIGS. 1 to 8 are cross-sectional views showing successive steps of a method for manufacturing one or several spiral springs according to the invention.

A first step of a method according to a preferred embodiment of the invention, represented in FIG. 1, consists in providing a silicon substrate 1 extending in a plane P and bearing on its upper face parallel to the plane P a silicon oxide (SiO$_2$) layer 2. The thickness (height) of the substrate 1 can equal that of the spiral spring(s) to be manufactured, i.e. typically 120 µm, or can be lower than that of the spiral spring(s) to be manufactured depending on whether the latter are made in the substrate 1 or in another layer as will be described below. In the second case, the substrate 1 is however sufficiently thick, typically of some tens of micrometers, to prevent its being deformed. The thickness of the silicon oxide layer 2 is of 3 µm, for example. The silicon of the substrate 1 can be monocrystalline, whatever its crystalline orientation, polycrystalline or amorphous.

Figure 2:
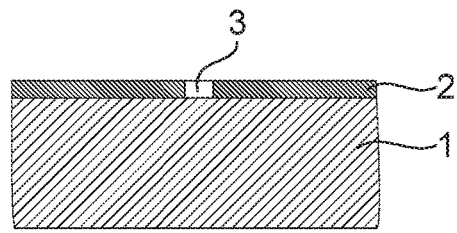

The silicon oxide layer 2 is then patterned, for example by photolithography, to form therein through holes 3 as shown in FIG. 2 where only one of these through holes 3 is visible. Concretely, the layer 2 is etched through a mask. The etching can be wet or dry but is preferably dry, with plasma, for better accuracy. The diameter of the holes 3 thus made is preferably lower than the width of the blade of the spiral springs to be manufactured. Typically, the holes 3 have a diameter of about 5 µm and the width of the blade of the spiral springs to be manufactured is of about 30 µm.

Figure 3:
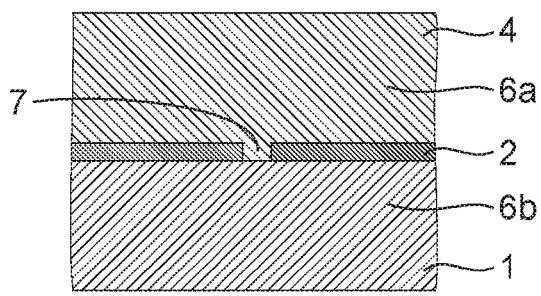

In a next step (FIG. 3), monocrystalline, polycrystalline or amorphous silicon is grown on the silicon oxide layer 2, for example by epitaxy, to form a silicon layer 4. During this step, the holes 3 of the silicon oxide layer 2 are filled with the silicon of the layer 4. The thickness of the silicon layer 4 equals that of the spiral spring(s) to be manufactured, i.e. typically 120 µm, or can be lower than that of the spiral spring(s) to be manufactured depending on whether the latter are made in this layer 4 or in the substrate 1. In the second case, the layer 4 is however sufficiently thick, typically of some tens of micrometers, to prevent its being deformed. In particular in the first case, and according to the condition of the upper surface of the layer 4, this upper surface can be polished, through e.g. chemical mechanical polishing (CMP), to remove the growth defects caused by the patterning of the silicon oxide layer 2 and/or to adjust the thickness of the silicon layer 4.

Figure 4:
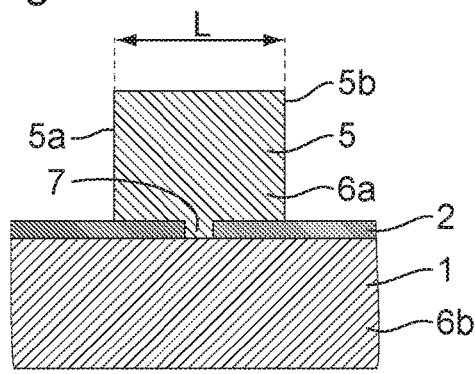

Next (see FIG. 4), either the silicon layer 4 or the silicon substrate 1 is patterned by deep reactive ion etching (DRIE) in order to form one or more spiral springs 5. In the present description, the one among the layer 4 and the substrate 1 that is patterned is called "etching layer" and designated by reference sign 6a, and the other one among the layer 4 and the substrate 1 is called "support" and designated by reference sign 6b. FIG. 4 represents the variant in which the spiral springs 5 are etched in the layer 4 and the substrate 1 forms the support 6b. In FIG. 4, only the cross-section of a turn of one of these spiral springs 5 is illustrated. Each spiral spring 5 can be formed simultaneously and in one piece with its collet for its subsequent mounting onto a balance shaft.

During this DRIE step, a mask is used for the etching and the core temperature of the plasma is in the order of 180° C. The support 6b is cooled to about 20° C., for example by means of helium scanning the face of the support 6b that is most distant from the etching layer 6a and/or by means of a circulating thermostatically-controlled cooling liquid cooling the chuck that supports the support 6b. Such a cooling of the support 6b cools the mask through the silicon oxide layer 2 and the etching layer 6a, thus avoiding the mask being burnt and the etching quality being affected. Such a cooling of the mask is made possible, in particular, by the thermal exchanges between the support 6b and the etching layer 6a. The continuous contact between the support 6b and the etching layer 6a, via the silicon oxide layer 2, improves these thermal exchanges with respect to the method according to patent EP 0732635. In this latter, indeed, in the etching zones the substrate and the crystalline material plate are linked only by bridges of material during the etching because of the cavities previously dug in the substrate. This is prejudicial to the thermal exchanges and to the etching homogeneity during the manufacturing.

Figure 9:
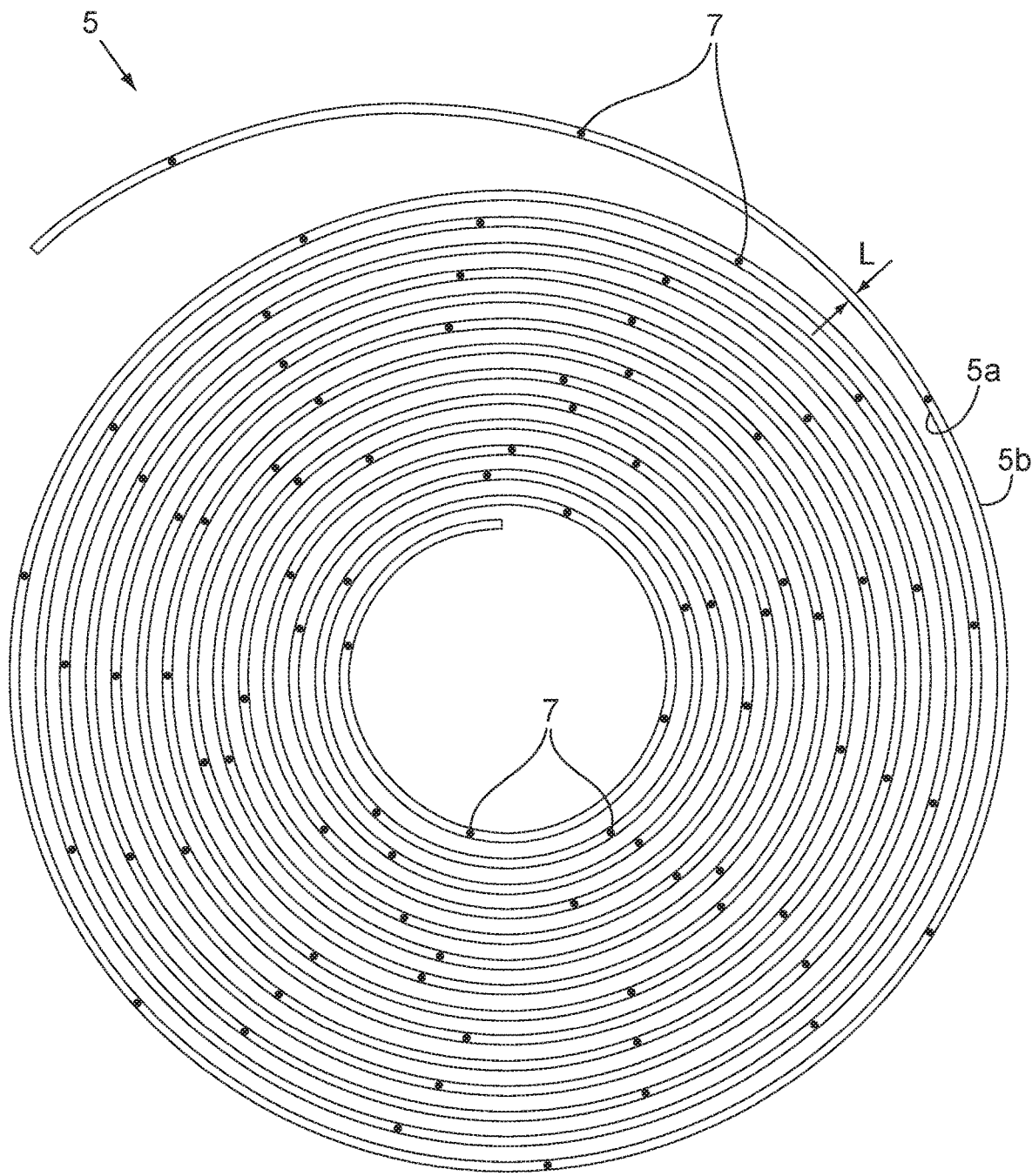
FIG. 9 is a top view of a spiral spring diagrammatically showing the location of its points of attachment to a support as it is being manufactured.

In the present invention, the spiral springs 5 formed in the etching layer 6a are linked to the support 6b perpendicularly to the plane P by the silicon oxide layer 2 and by the silicon that fills the holes 3. This silicon that fills the holes 3 forms bridges of material 7 which are in one piece with the spiral springs 5 and the support 6b. These bridges of material 7, which have the shape and the dimensions of the holes 3, are typically cylindrical with a circular cross-section but they can have another shape such as that of a cylinder with a polygonal cross-section or an oblong cross-section. They are located on the bottom or the top of the spiral springs 5. Preferably, in projection into the plane P, each bridge of material 7 is entirely located between the two sides 5a, 5b of the blade of a spiral spring 5, takes up only part of the width L of this blade, for example less than 50% or even less than 30% or even less than 20% of this width L, and is centered with respect to the two sides 5a, 5b to face the neutral fiber of the blade. Preferably, also, these bridges of material 7 are distributed over the whole length of each spiral spring 5, as diagrammatically shown in FIG. 9.

Figure 5:
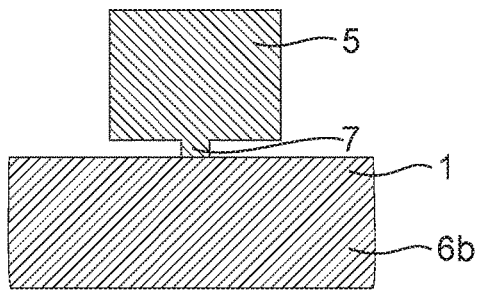

In a next step of the method according to the invention, the silicon oxide layer 2 is removed (FIG. 5), for example by chemical attack. The spiral springs 5 are then linked to the support 6b only by the bridges of material 7.

Figure 6:
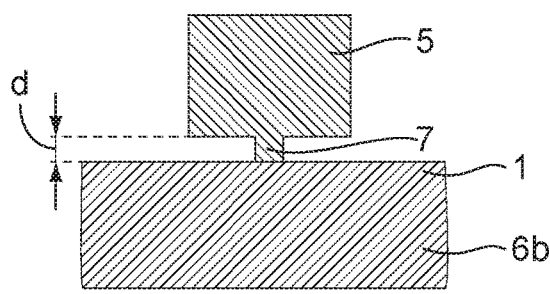

Then the method described in patent application EP 3181938 is performed in order to give a predetermined stiffness to the spiral springs 5. More precisely, some spiral springs 5 are detached from the support 6b and are coupled to balances having a predetermined inertia, the oscillation frequencies are measured, the average thereof is calculated, a stiffness value for the spiral springs 5 is deduced therefrom, a thickness of material to be removed from the spiral springs 5 to obtain the predetermined stiffness is calculated and this thickness of material is removed from the spiral springs 5 attached to the support 6b. These steps can be repeated in order to refine the dimensional accuracy of the spiral springs 5. To remove the calculated thickness of material, the spiral springs 5 are oxidized and then deoxidized. To this effect, the support 6b—spiral springs 5 assembly is placed into a furnace to subject it to a temperature comprised between 800 and 1200° C. and to an oxidizing atmosphere until a predetermined thickness of silicon oxide ($SiO_2$) is obtained on its surfaces. This silicon oxide layer is formed by consuming silicon over a depth approximately equaling half of its thickness. After this thermal treatment, the silicon oxide layer is removed, for example by chemical attack, in order to obtain spiral springs 5 having reduced dimensions corresponding to the predetermined stiffness (FIG. 6). This oxidation/deoxidation of the spiral springs 5 also enables to greatly reduce the ripples that the deep reactive ion etching creates on the sides of the spiral springs 5, as explained in patent application EP 3181938.

Figure 7:
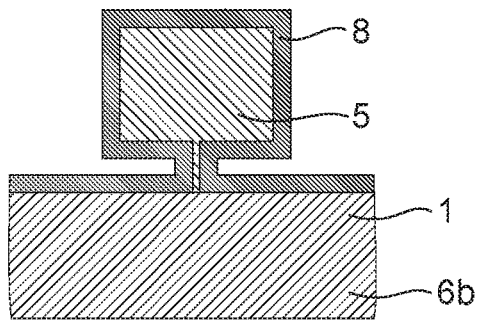

A next step of the method according to the invention, represented in FIG. 7, can consist in coating the spiral springs 5 with a thermal compensation layer 8 made of a material having a first thermal coefficient of the modulus of elasticity the sign of which is opposite to that of silicon, according to the teaching of patent EP 1422436. This thermal compensation layer 8 is typically made of silicon oxide ($SiO_2$). It can be formed by thermal oxidation, as described above, by placing the support 6b—spiral springs 5 assembly into a furnace to subject it to a temperature comprised between 800 and 1200° C. and to an oxidizing atmosphere until a predetermined thickness of silicon oxide is obtained on its surfaces. Since silicon oxide is formed by consuming silicon over a depth approximately equaling half of its thickness, the distance d between the spiral springs 5 and the support 6b in FIG. 6 must be greater than the thickness of the thermal compensation layer 8 to prevent them from touching each other. Thus, for example, this distance d is greater than 3 µm, or even than 4 µm, or even than 5 or 6 µm, for a thickness of the thermal compensation layer 8 of 3 µm. The thermal compensation layer 8, in particular when it is made of silicon oxide, also has the function of increasing the mechanical strength of the spiral springs 5.

The number of the bridges of material 7 per spiral spring is chosen sufficiently high to prevent the turns from collapsing and contacting the support 6b during passages in the furnace. This number depends, in particular, on the stiffness of the spiral springs 5. It can be reduced by arranging the support 6b—spiral springs 5 assembly in such a manner that the support 6b is above the spiral springs 5 during the oxidation phases.

In addition to the bridges of material 7 distributed along each spiral spring 5, bridges of material can be provided on the collet and/or on a rigid outer end of the spiral spring intended to be fixed to a frame bridge. Bridges of material can also be kept to laterally link the spiral springs 5 to one another so as to form a lace.

These bridges of material or attachment portions 7 linking the spiral springs 5 to the support 6b make it possible to avoid or at least decrease the permanent (plastic) deformations of the spiral springs 5 during the thermal oxidation phases. Indeed, silicon is a brittle material at room temperature (it can deform only elastically) but seems to have a ductile behavior from temperatures in the order of 800° C. to 1000° C. Deformations of the spiral springs 5 that are originally elastic and reversible during the positioning of the spiral springs 5 in the furnace may become permanent during the thermal treatment. The support 6b and the bridges of material 7 limit the deformations of the spiral springs 5, which spiral springs 5 will thus be able to have a shape similar to their theoretical shape at the end of their manufacturing.

Figure 8:
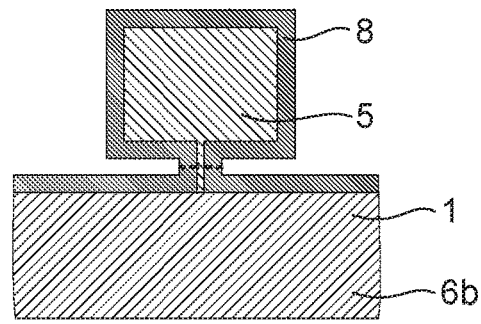

In a last step of the method according to the invention, represented in FIG. 8, the spiral springs 5 are released from the support 6b by breaking the bridges of material 7 by means of a tool. In a variant, the spiral springs 5 can be released by eliminating the bridges of material 7 by an etching operation with a mask performed from the face of the support 6b that is most distant from the spiral springs 5.

Whatever the means used to release the spiral springs 5, the zones of the spiral springs 5 where the bridges of material 7 are will not be covered by the thermal compensation layer 8. However, since these zones face the neutral fiber of the spiral springs 5, they will be little loaded in bending during the functioning of the spiral springs 5. They can therefore have a lower mechanical strength. Thermal compensation is very useful at the sides of the spiral springs 5 but less useful at the top and the bottom. Therefore, the lack of thermal compensation layer at the zones of the bridges of material 7 will little affect the behavior of the spiral springs 5 as regards temperature variations.

If however it is desired to prevent zones of the spiral springs 5 from being without thermal compensation layer after the rupture or elimination of the bridges of material 7, the diameter of the holes 3 and, therefore, of the bridges of material 7 can be decreased so that the bridges of material 7 only consist of silicon oxide after the formation of the thermal compensation layer 8.

In a variant of the invention, the bridges of material 7 of each spiral spring 5 are replaced with a single bridge of material forming, in projection into the plane P, a continuous spiral which follows the spiral shape of the blade of the spiral spring 5. Preferably, still in projection into the plane P, this bridge of material is entirely located between the two sides 5a, 5b of the blade, takes up only part of the width L of this blade, for example less than 50% or even less than 30% or even less than 20% of this width L, and is centered with respect to the two sides 5a, 5b of the blade.

The present invention is not limited to the materials, silicon and silicon oxide, mentioned above. It goes without saying that the present invention could apply to other materials, in particular, as regards the etching layer 6a, to any material that may be patterned by etching. The present invention is particularly advantageous for materials, such as silicon, glasses or ceramics, that are brittle at room temperature and ductile or potentially ductile at high temperature.

The invention claimed is:

1. Method for manufacturing at least one spiral spring (5) comprising the following successive steps:
   a) providing a substrate (1) extending in a determined plane (P) and bearing a first layer (2) parallel to the determined plane (P),
   b) forming at least one through hole (3) in the first layer (2),
   c) depositing a second layer (4) on the first layer (2), the second layer (4) filling the at least one through hole (3) to form at least one bridge of material (7), d) etching the at least one spiral spring (5) in an etching layer (6a) consisting of the second layer (4) or of the substrate (1), the one among the second layer (4) and the substrate (1) in which the at least one spiral spring (5) is not etched forming a support (6b), the at least one bridge of material (7) linking the at least one spiral spring (5) to the support (6b) perpendicularly to the determined plane (P), e) eliminating the first layer (2), the at least one spiral spring (5) remaining attached to the support (6b) by the at least one bridge of material (7), f) subjecting the at least one spiral spring (5) to at least one thermal treatment, g) detaching the at least one spiral spring (5) from the support (6b).

2. The method according to claim 1, wherein the thermal treatment or at least one of the thermal treatments is performed in a furnace.

3. The method according to claim 1, wherein the thermal treatment or at least one of the thermal treatments is performed at a temperature of at least 800° C.

4. The method according to claim 1, wherein the thermal treatment or at least one of the thermal treatments comprises a thermal oxidation.

5. The method according to claim 4, further comprising, between the steps f) and g), a deoxidation step, wherein the thermal oxidation and the deoxidation enable to decrease the dimensions of the at least one spiral spring (5) to obtain a predetermined stiffness.

6. The method according to claim 4, wherein the thermal oxidation aims at forming a thermal compensation layer (8) on the at least one spiral spring (5).

7. The method according to claim 1, wherein the etching layer (6a) is made of a material that is brittle at room temperature.

8. The method according to claim 1, wherein the etching layer (6a) is made of silicon or of a silicon-based material.

9. The method according to claim 1, wherein the etching layer (6a) is made of glass or of a glass-based material.

10. The method according to claim 1, wherein the etching layer (6a) is made of ceramic or of a ceramic-based material.

11. The method according to claim 1, wherein the support (6b) is made of silicon or of a silicon-based material.

12. The method according to claim 1, wherein the first layer (2) is made of silicon oxide or of a silicon-oxide-based material.

13. The method according to claim 1, wherein the step b) is performed by photolithography.

14. The method according to claim 1, wherein the step c) is performed by epitaxy.

15. The method according to claim 1, wherein the step d) is performed by deep reactive ion etching.

16. The method according to claim 1, wherein the support (6b) is cooled during the step d).

17. The method according to claim 1, wherein the at least one bridge of material (7) is distributed over substantially the whole length of the or each spiral spring (5).

18. The method according to claim 1, wherein in projection into the determined plane (P), the or each bridge of material (7) is entirely located between the two sides (5a, 5b) of a blade of the at least one spiral spring (5) and takes up only part of the width (L) of this blade.

19. The method according to claim 1, wherein in projection into the determined plane (P), the or each bridge of material (7) is substantially centered with respect to the two sides (5a, 5b) of a blade of the at least one spiral spring (5).

20. The method according to claim 1, wherein the thermal treatment or at least one of the thermal treatments is performed at a temperature of at least 900° C.

* * * * *